United States Patent [19]
Kao et al.

[11] Patent Number: 5,490,880
[45] Date of Patent: Feb. 13, 1996

[54] COMPOUND SEMICONDUCTORS AND A METHOD FOR THIN FILM GROWTH

[75] Inventors: Yung-Chung Kao; Francis G. Celii, both of Dallas, Tex.

[73] Assignee: Texas Instruments, Incorporated, Dallas, Tex.

[21] Appl. No.: 304,985

[22] Filed: Dec. 1, 1994

Related U.S. Application Data

[62] Division of Ser. No. 958,888, Oct. 9, 1992, Pat. No. 5,400,739.

[51] Int. Cl.⁶ .................................................. C23C 14/00
[52] U.S. Cl. ..................... 118/665; 118/690; 118/708; 118/712; 118/715; 118/726
[58] Field of Search ..................................... 118/715, 726, 118/665, 690, 708, 712

[56] References Cited

U.S. PATENT DOCUMENTS

| | | | |
|---|---|---|---|
| 4,639,377 | 1/1987 | Yamamoto | 427/10 |
| 5,171,399 | 12/1992 | Brennan et al. | 156/601 |

OTHER PUBLICATIONS

G. J. Davies & David Williams, "III–V MBE Growth Systems", *The Technology & Physics of Molecular Beam Epitaxy*, Plenum Press, pp. 15–18 & p. 22.

Yasuhiro Shiraki, "Silicon Molecular Beam Deposition", *The Technology and Physics of Molecular Beam Epitaxy*, Plenum Press, pp. 345–348 & p. 398.

R. S. Smith, et al "An electrical and photoluminescence study of pseudomorphic $GaAs/In_{.11}Ga_{.89}As/Al_{.23}Ga_{.77}AS$ HEMT structures" *IEE Colloquium on Helterojunction and Quantym Well Devices: Physics, Engineering & Applications* IEE, 90 pp (1988) pp. 13/1–13/4. (Abstract only).

T. M. Brennan, et al "Application of reflection mass spectrometry to Molecular–beam epitaxial growth of InAlAs and InGaAs" *J. Vac. Sci. Technology* B7 (2), Mar./Apr. 1989 pp. 277–282.

W. M. Lau, et al "Capping and Decapping of InP and InGaAs Surfaces" *J. Appl. Phys.* 67 (2), 15 Jan. 1990, pp. 768–773.

*Primary Examiner*—Richard Bueker
*Attorney, Agent, or Firm*—Michael K. Skrehot; James C. Kesterson; Richard L. Donaldson

[57] ABSTRACT

A molecular beam epitaxy (MBE) system (10) is provided to grow thin film, epitaxy layers (44, 46, 48, 50) on compound semiconductor substrates (40). A mass spectrometer detector (95) is used to monitor and control the flux from selected sources (21, 23, 25, 27) within the MBE system (10). A uniform layer of indium gallium arsenide (46, 50) may be grown on a semiconductor substrate (40) by controlling the indium flux with respect to substrate (40) temperature and time. An epitaxy layer (46) of indium gallium arsenide with uniform mole fraction concentration and reduced lattice strain is produced.

7 Claims, 3 Drawing Sheets

COMPOUND SEMICONDUCTORS AND A METHOD FOR THIN FILM GROWTH

This is a division of application Ser. No. 07/958,888, filed Oct. 9, 1992, now U.S. Pat. No. 5,400,739.

TECHNICAL FIELD OF THE INVENTION

This invention relates to semiconductor compounds and more particularly relates to equipment and methods for producing thin film layers on a compound semiconductor substrate.

BACKGROUND OF THE INVENTION

Integrated circuits have become more complex and smaller in scale as the applications for using integrated circuits have rapidly multiplied. Design requirements for such integrated circuits frequently exceed the capabilities of traditional silicon based semiconductor compounds. The search for higher performance, higher capacity and better frequency characteristics has resulted in developing new semiconductor compounds formed from elements in Group III and Group V of the Periodic Table. Combining elements from Group III and Group V has produced a new class of compound semiconductors which is particularly useful in high speed microwave and optical devices. Gallium (Group III) and arsenic (Group V) have been combined to produce gallium arsenide (GaAs) compound semiconductors.

A substantial amount of testing and development has been conducted with respect to gallium arsenide compound semiconductors. Various elements such as aluminum (Al) and indium (In) can be added to gallium arsenide to produce abrupt changes in band gap energies and refractive index. Aluminum gallium arsenide (AlGaAs) and gallium arsenide have nearly identical lattice constants which allows relatively thick layers (several microns) of aluminum gallium arsenide to grow on a gallium arsenide substrate. This characteristic results in gallium arsenide and aluminum gallium arsenide compounds being widely used in fabricating semiconductor devices. Indium gallium arsenide (InGaAs) has a significantly larger lattice constant as compared to gallium arsenide.

Another problem associated with present systems and methods for growing indium gallium arsenide epitaxy layers is that at high temperatures (500° C. and greater), the indium gallium arsenide layer generally has a higher mole fraction of indium at the interface with gallium arsenide and a lower mole fraction of indium at the interface with aluminum gallium arsenide. This change in indium concentration, related to evaporation and desorption of indium at higher temperatures while growing epitaxy layers, produces undesirable electrical characteristics. Since indium gallium arsenide has a bigger lattice constant as compared to gallium arsenide, stresses are present at the interface bond between the indium gallium arsenide layer and the gallium arsenide substrate. Changes in the mole fraction of indium and discontinuities in the lattice structure at the bond interface have previously limited or minimized the use of indium gallium arsenide in preparing epitaxy layers for semiconductor devices.

The first step in fabrication of an integrated circuit on a semiconductor chip is to grow a relatively large, single crystal or ingot from the desired semiconductor compound. Various techniques are commercially available for growing a single crystal from gallium arsenide compounds. These techniques are sometimes referred to as bulk growth procedures.

A large, single crystal or ingot of gallium arsenide will typically have dimensions of three to five inches in diameter and two to three feet in length. This large crystal is then sliced into thin wafers which provide a crystalline substrate of compound semiconductor material. One or more thin film layers (sometimes referred to as "epitaxy layers") are then deposited on the crystalline substrate to produce the electrical characteristics associated with semiconductor devices and integrated circuits. Various compounds and elements may be included within the thin film layers to modify the band gap energy and the refractive index of the layers as compared with the semiconductor material in the substrate and with other layers on the substrate.

Various techniques have previously been used to place thin film layers on semiconductor substrates. Examples of thin film technologies which have previously been used include liquid phase epitaxy, chemical vapor deposition, sputtering and vacuum evaporation. Molecular Beam Epitaxy (MBE) has been found to be a particular useful technique for placing a thin film layer on compound semiconductors such as gallium arsenide. With an understanding of surface physics and by observing variations in surface structure resulting from the relationship between arrival of an atom (beam flux) and substrate temperature, MBE allows preparation of high quality, thin film layers by adding one atomic layer upon the next atomic layer. This type of thin film layer growth is particularly advantageous in fabricating gallium arsenide semiconductors.

General background information on molecular beam epitaxy with respect to development of semiconductor materials and particularly with respect to gallium arsenide may be found in "The Technology and Physics of Molecular Beam Epitaxy" by E. H. C. Parker, published by Plenum Press in 1985. This book teaches the use of a mass spectrometry detector to monitor background levels for selected atoms or molecules in an MBE System. Mass spectrometers used for this purpose are sometimes referred to as residual gas analyzer probes. Mass spectrometers have also been used in MBE Systems to detect undesired leaks from sources in the MBE System.

A substantial amount of work has been conducted to develop gallium arsenide semiconductors with epitaxy layers formed from aluminum gallium arsenide (AlGaAs) compounds. The use of indium gallium arsenide (InGaAs) as a ternary compound to grow an epitaxy layer on gallium arsenide substrates along with an aluminum gallium arsenide epitaxy layer offers substantial electrical advantages in integrated circuit design for fabrication on a semiconductor chip as compared to only an aluminum gallium arsenide epitaxy layer.

Therefore, a need has arisen for equipment and methods to grow high quality indium gallium arsenide epitaxy layers on a gallium arsenide substrate with uniform strain characteristics in the lattice structure and uniform mole fraction composition in the surface and subsurface layers of the semiconductor chip.

SUMMARY OF THE INVENTION

In accordance with the present invention, disadvantages and problems associated with growing thin film layers of indium gallium arsenide on a gallium arsenide substrate have been substantially reduced or eliminated.

Mass spectrometry monitoring is used with a molecular beam epitaxy system to grow thin film layers on a compound semiconductor substrate such as gallium arsenide. A mass spectrometry detector is positioned within the MBE system to detect both background signals for a selected atom and signals reflected from the substrate surface. The resulting epitaxy layers have a strained heterostructure lattice and uniform mole fraction composition.

In accordance with one aspect of the present invention, a mass spectrometry detector is placed within the molecular beam epitaxy system to monitor molecular growth on a compound semiconductor substrate. Indium gallium arsenide layers which are uniform in both composition and lattice structure are grown on the substrate by varying the indium flux and substrate temperature with respect to time.

The present invention has significant technical advantages in that it provides a method for growing high quality indium gallium arsenide and aluminum gallium arsenide layers on gallium arsenide to produce low noise semiconductor devices for high power applications. Using in situ mass spectrometry, the indium flux and substrate temperature are varied within a molecular beam epitaxy system to produce the high quality indium gallium arsenide layer.

Another significant technical advantage of the present invention is the use of a mass spectrometry detector within a molecular beam epitaxy system to grow an epitaxy layer with a uniform mole concentration of indium gallium arsenide throughout the layer and a uniform strained heterostructure at the interface between indium gallium arsenide and gallium arsenide. Varying the indium flux in response to information provided by the mass spectrometry detector will compensate for variations in the indium incorporation rate within the epitaxy layer. The advantages of the present invention may be extended to use in growing other strained layers within a molecular beam epitaxy system.

A further technical advantage of the present invention is producing high quality aluminum gallium arsenide/indium gallium arsenide/gallium arsenide strained hetero-structures with uniform indium mole fraction using in situ mass spectrometry monitoring. The present invention allows growing epitaxy layers with optimum indium mole fraction concentration and optimum thickness of the indium gallium arsenide layer during fabrication of a semiconductor device. By varying the indium flux rate with respect to substrate temperature and time, uniform incorporation of indium is produced in the desired epitaxy layer. The loss of indium from the epitaxy layer during temperature cycling for growth of aluminum gallium arsenide has been substantially eliminated by adding a thin cap layer of gallium arsenide or aluminum gallium arsenide.

BRIEF DESCRIPTION OF THE DRAWINGS

For a more complete understanding of the present invention and the advantages thereof, references is now made to the following description taken in conjunction with the accompanying drawings, in which.

DETAILED DESCRIPTION OF THE INVENTION

The preferred embodiment of the present invention and its advantages are best understood by referring to FIGS. 1 through 7 of the drawings, like numerals being used for like and corresponding parts of the various drawings.

Figure 1:
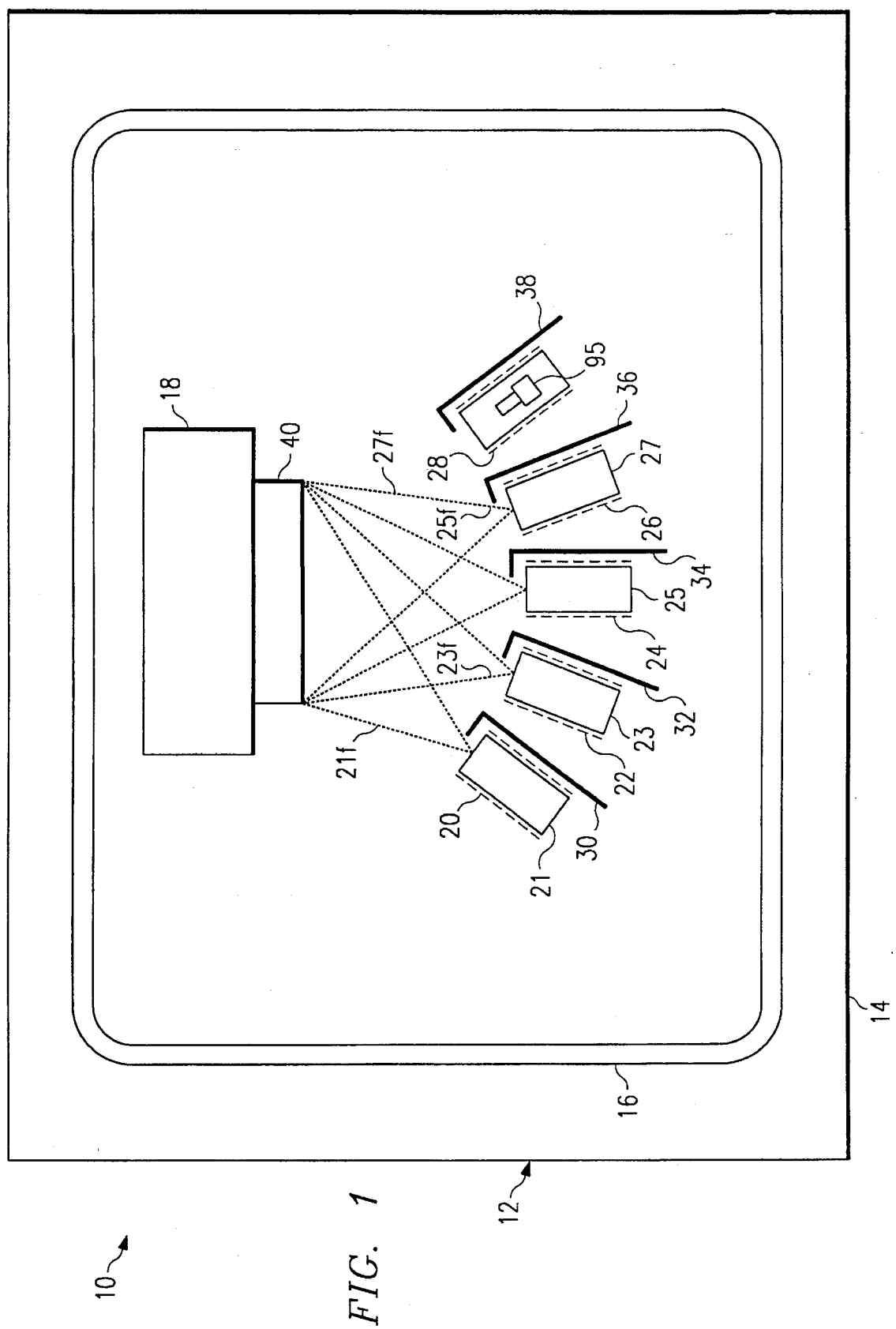
FIG. 1 is a schematic plan view with portions broken away of a molecular beam epitaxy (MBE) system incorporating the present invention.

The principle components of Molecular Beam Epitaxy (MBE) System 10, shown in FIG. 1, are contained within chamber 12. Wall 14 of chamber 12 is designed to maintain an ultra high vacuum (less than $10^{-10}$ Torr) within chamber 12. The additional components of MBE System 10 are surrounded by cryogenic paneling 16 which is preferably filled with liquid nitrogen. FIG. 1 shows only a single ultra high vacuum chamber 12. In actual practice, a molecular beam epitaxy system may contain a plurality of ultra high vacuum chambers (not shown) which are interconnected to communicate with each other through appropriately designed gate valves (not shown).

Substrate holder 18 is contained within chamber 12 to hold substrate 40 on which a plurality of epitaxy layers may be grown. Substrate holder 18 will preferably include equipment to rotate substrate 40 and to heat substrate 40 to selected temperatures depending upon the characteristics of the semiconductor compounds used to produce substrate 40 and the epitaxy layers. A plurality of cells 20, 22, 24, 26 and 28 are provided within chamber 12. Shutters 30, 32, 34, 36 and 38 are used to control communication with their respective cells 20, 22, 24, 26 and 28. If desired, each cell 20, 22, 24, 26 and 28 could be a separate small vacuum chamber attached to chamber 12. Ionizing beam sources 21, 23, 25 and 27 are disposed within cells 20, 22, 24 and 26 respectively. Sources 21, 23, 25 and 27 produce an atomic or molecular flux $21f$, $23f$, $25f$, and $27f$ respectively depending upon the characteristics of each source. The flux beams are used to grow the desired epitaxy layers on substrate 40 in MBE System 10.

Cell 28 contains mass spectrometer detector 95. Various types of mass spectrometers satisfactory for use with the present invention are commercially available. Mass spectrometer detector 95 is preferably a compact quadrapole detector sized to fit within cell 28. Shutter 38 may be opened and closed to allow mass spectrometer detector 95 to monitor selected atoms or molecules from gases within chamber 12. An important element of the present invention is mounting mass spectrometer detector in situ in chamber 12 to receive signals directly from the surface of substrate 40 in addition to background signals within chamber 12.

Figure 5:
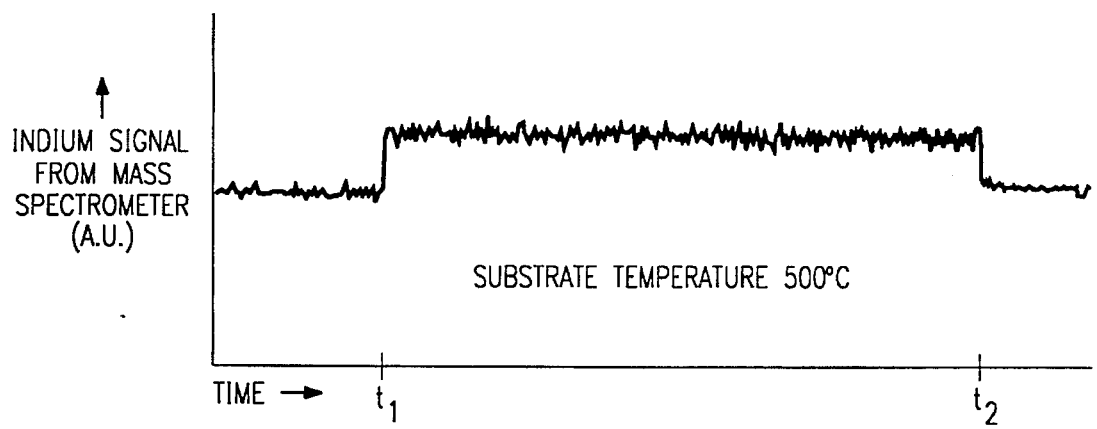
FIG. 5 is a graph showing an indium signal versus time.
Figure 6:
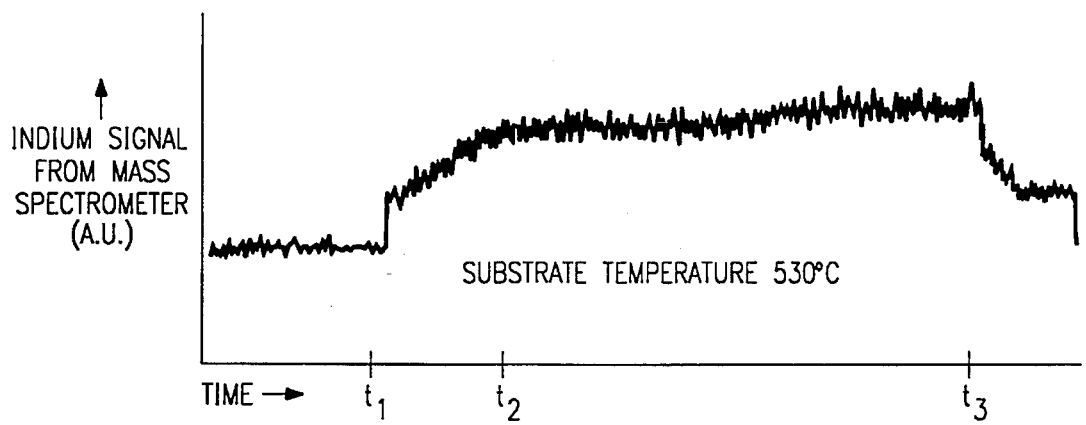
FIG. 6 is a graph showing an indium signal versus time.
Figure 7:
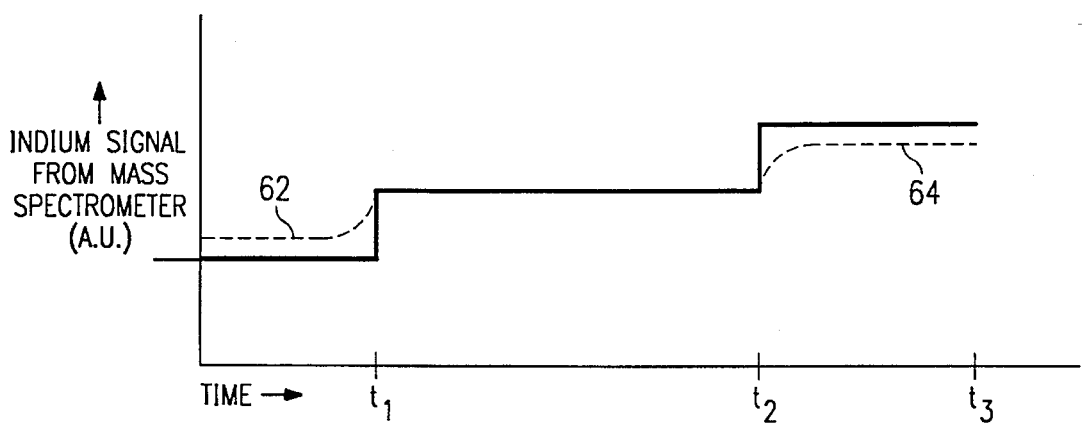
FIG. 7 is a graph of an indium signal which has been produced in accordance with the present invention in the MBE system of FIG. 1.

When shutter 38 is opened, detector 95 will measure both background level for a selected gas molecule or atom in chamber 12 and signals for the selected molecule or atom received from the surface of substrate 40. The received signal includes reflection of flux beams $21f$, $23f$, $25f$ or $27f$ from the surface of substrate 40 if the respective flux beam includes the selected atom or molecule. The received signal from substrate 40 will also include atoms which have been desorbed or evaporated from epitaxy layers on substrate 40. Elements such as indium may segregate into "pools" at the surface of an epitaxy layer resulting in a high evaporation rate at elevated temperatures. The graphs shown in FIGS. 5, 6, and 7 are based on signals from mass spectrometer detector 95 sent to an RF Analyzer (not shown).

Figure 2:
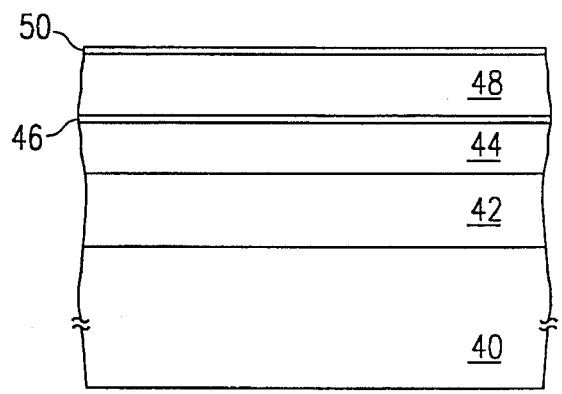
FIG. 2 is a schematic drawing in section with portions broken away of a compound semiconductor substrate and epitaxy layers fabricated in accordance with the present invention.

FIG. 2 shows a schematic representation of substrate 40 which may be secured to substrate holder 18 of MBE System 10. Various semiconductor compounds could be used to produce substrate 40. The present invention will be described with respect to gallium arsenide compound semiconductors. Substrate 40 is formed by slicing a thin wafer from a large, single crystal (not shown) of gallium arsenide. One or more relatively thick (approximately one micron) buffer layers 42 of gallium arsenide are then formed on top of substrate 40 to correct for any irregularities or deformities in the surface of substrate 40 resulting from slicing the thin wafer and mounting substrate 40 on substrate holder 18. Fabricating buffer layer 42 may require over sixty percent of the total time that substrate 40 is within MBE System 10.

Layer 44 of indium gallium arsenide may then be deposited on buffer layer 42 in accordance with the present invention. An important feature of the present invention includes adding a cap layer of gallium arsenide 46 on top of indium gallium arsenide layer 44. Cap layer 46 is relatively thin, approximately ten angstroms, as compared to the other epitaxy layers on substrate 40. Aluminum gallium arsenide may also be used to grow cap layer 46. Layer 46 cooperates with other features of the present invention to maintain a uniform concentration of indium within epitaxy layer 44 by limiting desorption of indium when the temperature of substrate 40 is raised to grow aluminum gallium arsenide layer 48.

Layer 48 may be formed from aluminum gallium arsenide and include other doping materials as required for the specific integrated circuit which will be fabricated on the semiconductor device. An optional cap layer of gallium arsenide 50 may then be placed upon epitaxy layer 48 as required by the circuit design or to prevent undesired oxidation of aluminum from layer 48. MBE System 10 may be used to grow a plurality of layers 42, 44, 46, and 48 on substrate 40 as a continuous process without requiring removal of substrate 40 from holder 18. The specific number of indium gallium arsenide layers and aluminum gallium arsenide layers grown in MBE System 10 will depend upon the specific integrated circuit design.

During the process of forming epitaxy layers of indium gallium arsenide 44 and aluminum gallium arsenide 48 on substrate 40, substrate holder 18 and substrate 40 will typically be heated to selected temperatures in the range of 400° to 700° C. At elevated temperatures (greater than 500° C.), arsenic has a tendency to decompose from the surface of substrate 40 and from layers 42 44, 46, 48, and 50. The partial pressure of arsenic within chamber 12 will typically be five to ten times higher than the partial pressure of gallium and other Group III elements within chamber 12 to suppress the tendency of arsenic to decompose from surface layers on substrate 40. With an appropriate overpressure of arsenic in chamber 12, cell 20 containing arsenic source 21 may be opened by shutter 30 and cell 22 containing gallium source 23 may be opened by shutter 32 to grow buffer layer 42 on substrate 40 using MBE System 10.

Cell 24 preferably contains indium source 25 and cell 26 contains aluminum source 27. In order to grow a layer of indium gallium arsenide on substrate 40, shutter 34 is open to exposed indium source 25 along with opening shutter 30 for arsenic source 21 and shutter 32 for gallium source 23. In the same manner, when growing an aluminum gallium arsenide epitaxy layer, shutter 36 will be opened for aluminum source 27. During the fabrication of an integrated circuit, various doping compounds may also be placed within selected epitaxy layers. Therefore, MBE System 10 is not limited to only five cells as shown in FIG. 1. Additional cells may be added for each element or compound which will be added to an epitaxy layer on substrate 40.

The temperature of substrate holder 18 and substrate 40 is varied in accordance with the present invention depending upon the type of epitaxy layer which is being grown on substrate 40. The temperature for each cell may vary between 1000° C. to 1600° C. depending upon the type of element or compound source within the respective cells. Increasing the temperature of a cell will generally increase the atomic or molecular beam flux emitted by each source from its respective cell. In the same manner, reducing the temperature of a cell will generally reduce the beam flux associated with the specific source and cell.

Relatively thin layers of indium gallium arsenide may be grown at temperatures of 500° C. and less. The mole concentration of indium in an epitaxy layer grown at this lower temperature is generally uniform but the lattice structure will have defects and discontinuities. Therefore, the resulting thin layer has electrical properties which are less than desired. Indium gallium arsenide layers grown in the temperature range of 500°–550° C. have optimum electrical characteristics. However, at these higher temperatures, the indium concentration becomes less uniform and increased strain is noted within the lattice structure. The optimum temperature for growing an aluminum gallium arsenide epitaxy layer is 620° C. or higher. At these elevated temperatures a significant change in mole concentration of indium will occur. Therefore, without the present invention the optimum temperature (500°–550° C.) for growing an indium gallium arsenide epitaxy layer is not compatible with the optimum temperature ($\geq$620° C.) for growing an aluminum gallium arsenide epitaxy layer.

Figure 3:
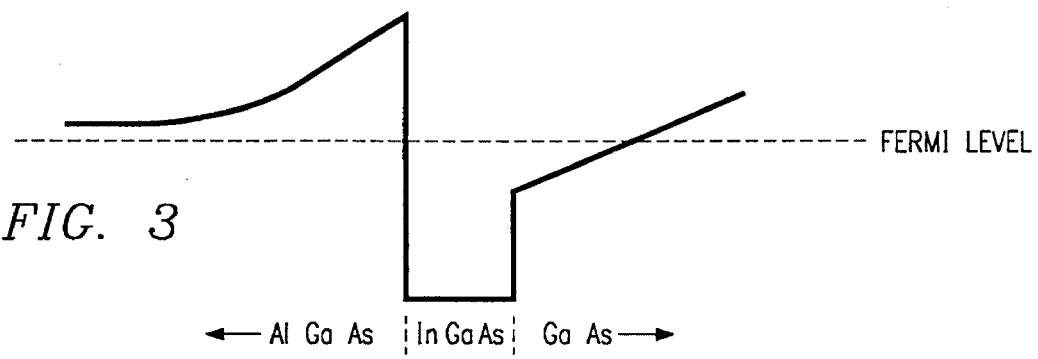
FIG. 3 is a graph of the band gap energy near the hetero-structure interface between AlGaAs, InGaAs, and GaAs.

FIG. 3 is a representation of the relative bandgap energies of gallium arsenide, indium gallium arsenide, and aluminum gallium arsenide. Since the bandgap of indium gallium arsenide is substantially less than either aluminum gallium arsenide or gallium arsenide, indium gallium arsenide can be used to significantly improve carrier confinement and transport properties of the resulting semiconductor device. The benefits of using indium gallium arsenide have been well known. Increased indium mole concentration reduces bandgap energy and produces better semiconductor characteristics. Increased indium concentration unfortunately also produces increased strain in the lattice structure. Differences in lattice constant and optimum temperature for epitaxy layer growth have prevented effective fabrication of indium gallium arsenide layers with layers of gallium arsenide and aluminum gallium arsenide.

Figures 4A, 4B:
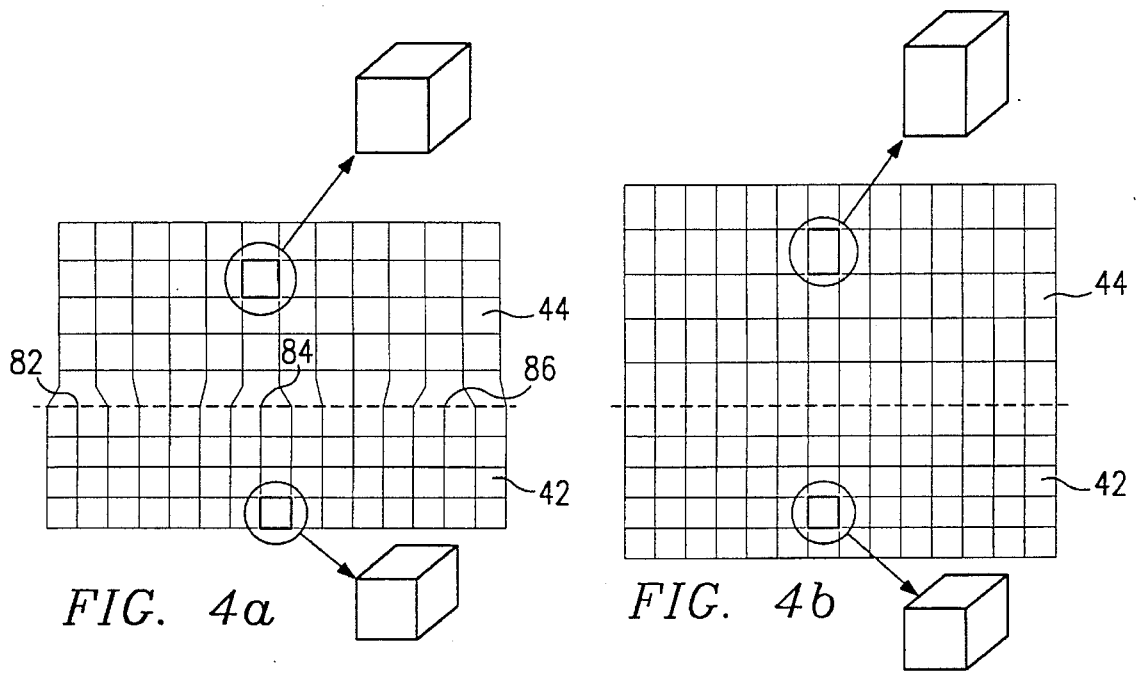
FIGS. 4a and 4b are schematic drawings showing typical lattice structures for a compound semiconductor substrate and epitaxy layer.

FIG. 4a shows interfacial dislocations at 82, 84, and 86 and the resulting strain which could occur between gallium arsenide layer 42 and indium gallium arsenide layer 44. The dislocation or misfit between the lattice structure at the epitaxy layer interface will cause increased strain and will potentially limit the thickness of indium gallium arsenide layer 44. Defects such as 82, 84, and 86 at the strained layer interface may trap carriers and produce undesirable electrical characteristics in the finished semiconductor device. The strained layers represented by FIG. 4a will prevent growing an indium gallium arsenide layer of optimum thickness. Defects at the interface between the epitaxy layers and the substrate degrade the quality of the epitaxy film and result in reduced semiconductor capabilities.

FIG. 4b shows a more uniform elastic strain between indium gallium arsenide layer 42 and indium gallium arsenide layer 44 resulting from growing epitaxy layer 44 in accordance with the present invention. Dislocations and misfits which can result from variations in indium concentration in epitaxy layer 44 are reduced or eliminated. The present invention minimizes discontinuities and deformities in the lattice structure at the interface of epitaxy layers 42, 44, 46, 48 and 50.

By using mass spectrometry detector 95 in MBE System 10, it is possible to measure and record a signal for a selected atom or molecule received from substrate 40 and background level in chamber 12 versus time. FIG. 5 shows the indium signal versus time within chamber 12 as measured by detector 95. FIG. 5 demonstrates that when substrate holder 18 and substrate 40 are heated to 500° C. or less, indium can be deposited on substrate 40 at a relatively uniform rate with respect to time. The indium signal measured from time zero to $t_1$ represents the background level of indium within chamber 12. At time $t_1$, shutter 34 is opened to project indium beam flux 25f from source 25 into chamber 12 directed at substrate 40. With the temperature of substrate 40 at 500° C. the indium signal within chamber 40 is relatively flat between times $t_1$ and $t_2$. This flat curve indicates low reflection and desorbtion and a uniform low rate of indium growth in epitaxy layer 44 on substrate 40. At time $t_2$ shutter 34 is closed and the indium signal in chamber 12 rapidly decays to a new background level. The background level at $t_2$ is slightly higher than at $t_1$ as a result of incorporating a small amount of indium into epitaxy layer 44 on substrate 40.

As previously noted, at temperatures less than 500° C., the indium gallium arsenide layer grows at a relatively low rate, is thin and has very poor electrical properties. High quality indium gallium arsenide epitaxy layers are generally produced when substrate holder 18 and substrate holder 40 are heated to temperatures between 500° C. and 550° C. A more uniform strained heterostructure is produced in this elevated temperature range.

FIG. 6 demonstrates the increase in indium signal which occurs at substrate temperatures between 500° C. and 550° C. The increased indium signal detected by mass spectrometer 95 shown in FIG. 6 shows a higher evaporation or desorbtion rate of indium and therefore potentially lower incorporation of indium into epitaxy layer 44. During the first time interval zero to $t_1$, shutter 34 for indium source 25 is closed and detector 95 records only the background indium-signal in chamber 12. At time $t_1$, shutter 34 for source 25 is opened to emit indium flux 25f into chamber 12. From time $t_1$ to $t_2$ the indium signal increases at a relatively rapid rate indicating high reflection and desorbtion of indium from epitaxy layer 44. From time $t_2$ to time $t_3$, the indium signal increases only slightly at a more uniform rate indicating a steady state condition for indium incorporation within epitaxy layer 44. At time $t_3$, shutter 34 for source 25 is closed and the indium signal decreases to normal background. The decay in the indium signal after $t_3$ is substantially different than the decay in the indium signal shown in FIG. 5. The gradual decrease in the indium signal and the overall higher background signal indicate that a substantially greater amount of indium has been deposited in epitaxy layer 44.

The result of varying the temperature of substrate 40 and the indium flux from source 25 to produce a stair step pattern is demonstrated by FIG. 7. Indium gallium arsenide epitaxy layer 44 is preferably grown using the stair step pattern shown in FIG. 7. The initial portion of epitaxy layer 44 is grown with substrate 40 at a temperature of 500° C. or less. The indium flux from source 25 will be at a relatively low level with a low rate of indium evaporation from substrate 40 during this first time interval. After the first time interval, the temperature of substrate 40 is increased to 530° C. at time $t_1$ which causes a significant increase in the indium evaporation and desorbtion rate at the surface of layer 44. Therefore, a higher indium flux from source 25 is required for layer 44 to continue steady growth with uniform indium concentration. The flux from indium source 25 will preferably be increased at this time. By changing the temperature of cell 24 and indium source 25 at time $t_1$ to correspond with changes in the temperature of substrate 40, the concentration of indium will be more uniform and maintained at the desired level as layer 44 continues to grow.

At $t_2$ the temperature of substrate 40 may be increased to a higher value such as 550° C. and the temperature or flux from indium source 25 also increased. Again, the higher indium signal indicates a higher level of indium is being received from epitaxy layer 44. By using the stair step pattern with both the temperature of substrate 40 and flux from source 25, a uniform indium concentration with the desired electrical characteristics is produced in epitaxy layer 44 with uniformed lattice strain as compared to previous procedure for growing epitaxy layers.

Mass spectrometry detector 95 allows optimizing the changes in the temperature of substrate 40 and the flux from source 25 to produce the desired mole fraction of indium within epitaxy layer 44 and desired thickness of layer 44. A typical time period for exposure of the indium source would be approximately 60 seconds. By maintaining a higher flux at selected time periods, indium will incorporate into epitaxy layer 44 and produce a more uniform indium concentration. The flux from the other cells is maintained relatively constant during the growth of epitaxy layer 44. Only flux 25f from indium source 25 is varied. Dotted lines 62 and 64 in FIG. 7 represent changes in the indium signal which may be caused by changing the temperature of substrate 40 and indium flux 25f from source 25 to achieve the desired electrical characteristics in the final semiconductor device. Mass spectrometer detector 95 allows adjusting the flux level and time intervals for optimum growth of the epitaxy layers with the desired electrical characteristics.

The present invention may be effectively used to grow epitaxy layers comprising other ternary compounds selected from elements in Group III and Group V of the periodic table and is not limited to growing indium gallium arsenide epitaxy layers. The present invention is particularly useful with ternerary compounds subject to strained layer growth and variations in the incorporation rate of Group III elements in the epitaxy layer.

Although the present invention has been described in detail, it should be understood that various changes, substitutions and alterations can be made without departing from the spirit and scope of the invention as defined in the following claims.

What is claimed is:

1. A system for growing epitaxy layers on a compound semiconductor substrate, said system comprising:

a vacuum chamber having a substrate holder;

a plurality of cells to hold atomic and/or molecular sources;

means for selectively opening and closing said cells;

a mass spectrometry detector positioned to sense the level of atoms or molecules in said chamber, said detector generating a signal proportionate to said level of atoms or molecules; and memos for adjusting the flux from said cells and the temperature of said substrate holder in response to said signal.

2. The system for growing epitaxy layers as defined in claim 1, wherein said mass spectrometry detector is inside said chamber.

3. The system for growing epitaxy layers as defined in claim 1 further comprising the mass spectrometry detector positioned to receive signals reflected from the surface of the semiconductor substrate.

4. The system for growing epitaxy layers are defined in claim 1 wherein one of said plurality of cells contains indium.

5. A system for forming thin film layers on a semiconductor substrate, said system comprising:

a temperature-controllable substrate holder;

a plurality of atomic and/or molecular sources;

a mass spectrometer positioned to sense atoms or molecules emitted from said sources;

means for varying the temperature of said substrate holder and the flux of at least one of said sources in response to a signal from said mass spectrometer.

6. The system of claim 5 wherein at least one of said sources is a cell containing indium.

7. The system of claim 5 wherein said substrate holder, said sources, and said mass spectrometer are inside a vacuum chamber.

* * * * *